United States Patent
Lee et al.

(10) Patent No.: US 9,096,946 B2
(45) Date of Patent: Aug. 4, 2015

(54) REUSABLE DUAL CRUCIBLE FOR SILICON MELTING AND MANUFACTURING APPARATUS OF SILICON SLIM PLATE INCLUDING THE SAME

(75) Inventors: Jin Seok Lee, Daejeon (KR); Bo Yun Jang, Deajeon (KR); Young Soo Ahn, Daejeon (KR)

(73) Assignee: Korea Institute of Energy Research, Daejeon (KR)

( * ) Notice: Subject to any disclaimer, the term of this patent is extended or adjusted under 35 U.S.C. 154(b) by 922 days.

(21) Appl. No.: 13/304,497

(22) Filed: Nov. 25, 2011

(65) Prior Publication Data
US 2012/0288418 A1 Nov. 15, 2012

(30) Foreign Application Priority Data
May 12, 2011 (KR) .......................... 10-2011-0044752

(51) Int. Cl.
| C30B 35/00 | (2006.01) |
| C30B 15/00 | (2006.01) |
| C30B 15/10 | (2006.01) |
| C30B 29/06 | (2006.01) |

(52) U.S. Cl.
CPC ............... *C30B 15/007* (2013.01); *C30B 15/10* (2013.01); *C30B 29/06* (2013.01); *C30B 35/002* (2013.01)

(58) Field of Classification Search
None
See application file for complete search history.

(56) References Cited

U.S. PATENT DOCUMENTS

| 4,670,096 | A | * | 6/1987 | Schwirtlich et al. ............ 117/27 |
| 4,710,260 | A | * | 12/1987 | Witter et al. .................. 423/350 |
| 4,762,687 | A | * | 8/1988 | Belouet et al. ................ 118/708 |
| 5,360,480 | A | * | 11/1994 | Altekruger .................... 117/214 |
| 6,361,597 | B1 | * | 3/2002 | Takase et al. .................... 117/18 |
| 6,423,137 | B1 | * | 7/2002 | Takase ........................... 117/214 |
| 2004/0187771 | A1 | * | 9/2004 | Tsuji et al. ..................... 117/220 |
| 2005/0275144 | A1 | * | 12/2005 | Muhe et al. .................... 266/216 |
| 2005/0279275 | A1 | * | 12/2005 | Holder ............................ 117/13 |
| 2011/0303290 | A1 | * | 12/2011 | Jang et al. ...................... 136/261 |
| 2011/0305891 | A1 | * | 12/2011 | Jang et al. ...................... 428/220 |

FOREIGN PATENT DOCUMENTS

JP 61026593 A * 2/1986

* cited by examiner

*Primary Examiner* — Anita Alanko
(74) *Attorney, Agent, or Firm* — Patent Office of Dr. Chung Park

(57) ABSTRACT

A dual crucible for silicon melting and a manufacturing apparatus of a silicon thin film including the same are disclosed. The dual crucible for the silicon melting includes a graphite crucible formed in a container shape with an open top and a bottom having an outlet part formed therein to exhaust silicon melt, the graphite crucible comprising a slope part configured to connect the outlet part and an inner wall with each other, with a predetermined slope with respect to a top surface of the outlet part, and a quartz crucible insertedly coupled to the graphite crucible, with being formed in a corresponding shape to the graphite crucible, the quartz crucible having a silicon base material charged therein.

8 Claims, 4 Drawing Sheets

REUSABLE DUAL CRUCIBLE FOR SILICON MELTING AND MANUFACTURING APPARATUS OF SILICON SLIM PLATE INCLUDING THE SAME

CROSS-REFERENCE TO RELATED APPLICATION

This application claims priority under 35 U.S.C. §119 from Korean Application No. 10-2011-0044752 filed on May 12, 2011, the subject matter of which is incorporated herein by reference.

BACKGROUND

1. Field

Embodiments may relate to a dual crucible for silicon melting, more particularly, to a reusable dual crucible structure and a manufacturing apparatus of a silicon thin film including the reusable dual crucible structure.

2. Background

A graphite crucible has been used as crucible for silicon melting that is used in manufacturing a silicon wafer for a solar cell or a semiconductor.

A process of manufacturing such a silicon wafer for a solar cell or a semiconductor has to accompany a process of melting a silicon material. The graphite crucible used in this case might give rise to mixture of carbon and metal impurities. Because of that, researches and studies on usage of a dual crucible structure having a quartz crucible inserted in the graphite crucible have been in progress.

However, a silicon melting process that uses such a dual crucible may be performed at a high temperature of approximately 1412° C. or more. In this case, when molten silicon remaining in the dual crucible after melting silicon is coagulated, volume expansion may be generated and this may be a factor causing breakage of the quartz crucible. As a result, there might be a disadvantage that the high-priced quartz crucible cannot but be a single use crucible and the difficulty lines in a silicon ingot and a low price of the wafer.

SUMMARY

Accordingly, the embodiments may be directed to a dual crucible for silicon melting. To solve the problems, an object of the embodiments may be to provide a dual crucible for silicon melting that includes a high-priced quartz crucible designed to be reusable, not disposal.

Another object of the embodiments may be to provide a manufacturing apparatus of a silicon thin film including the dual crucible designed to be reused at least two times or more.

To achieve these objects and other advantages and in accordance with the purpose of the embodiments, as embodied and broadly described herein, a dual crucible for silicon melting includes a graphite crucible formed in a container shape with an open top and a bottom having an outlet part formed therein to exhaust silicon melt, the graphite crucible comprising a slope part configured to connect the outlet part and an inner wall with each other, with a predetermined slope with respect to a top surface of the outlet part; and a quartz crucible insertedly coupled to the graphite crucible, with being formed in a corresponding shape to the graphite crucible, the quartz crucible having a silicon base material charged therein.

A surface of the slope part may have a slope of 3° or more with respect to the top surface of the outlet part.

The graphite crucible may include a plurality of slits partially cut away along a longitudinal direction of the graphite crucible.

The quartz crucible may have a predetermined surface area corresponding to the graphite crucible, to block the graphite crucible from contacting with the silicon base material.

In another aspect, a dual crucible for silicon melting includes a quartz crucible including an inlet part to charge a silicon base material therein, a slope part extended from the inlet part, with a slope of an acute angle with respect to a surface of the inlet part, and an outlet part extended from the slope part in parallel to the inlet part, with an opening smaller than an opening of the inlet part; and a graphite crucible to surround the quartz crucible.

The maximum of the acute angle may be 87°.

An overall outer surface of the quartz crucible may be in sheet-contact with an overall inner surface of the graphite crucible.

The graphite crucible may include a plurality of slits partially cut away along a longitudinal direction of the graphite crucible.

In a further aspect, a manufacturing apparatus of a silicon thin film include a silicon base material introduction part to supply a silicon base material; a dual crucible for silicon melting mounted under the silicon base material introduction part; a crucible heating part to heat the dual crucible for the silicon melting, to form molten silicon by melting the silicon base material; a molten silicon storage part to store the molten silicon therein and to tap the stored molten silicon as the preset amount of silicon melt after that; a transfer substrate disposed under the molten silicon storage part, to transfer the tapped silicon melt; and a thin film forming part to form a silicon thin film by cooling the silicon melt transferred by the transfer substrate, wherein the dual crucible for the silicon melting may include a graphite crucible formed in a container shape with an open top and a bottom having an outlet part formed therein to exhaust silicon melt, the graphite crucible comprising a slope part configured to connect the outlet part and an inner wall with each other, with a predetermined slope with respect to a top surface of the outlet part; and a quartz crucible insertedly coupled to the graphite crucible, with being formed in a corresponding shape to the graphite crucible, the quartz crucible having a silicon base material charged therein.

The slope part may have a slope of 3° or more with respect to a top surface of the outlet part.

The crucible heating part may include a coil to surround an outer wall of the dual crucible for the silicon melting.

The manufacturing apparatus of the silicon thin film may further include a gate bar to open and close the outlet hole.

The crucible heating part may heat the dual crucible for the silicon melting to make a surface temperature of the molten silicon have a range of 1300° C.~1600° C.

The transfer substrate may be formed of a predetermined material having a different thermal expansion coefficient than a thermal expansion coefficient of the silicon.

The transfer substrate may be formed of a predetermined material selected from a group configured of metal, ceramic, SiC, $Si_3N_4$, graphite, $Al_2O_3$ and molybdenum (Mo).

The embodiments have following advantageous effects. According to the dual crucible for the silicon melting, the quartz crucible may have the slope part. As a result, all of the molten silicon may be exhausted via the outlet hole, without remaining in the dual crucible advantageously.

It is to be understood that both the foregoing general description and the following detailed description of the embodiments or arrangements are exemplary and explanatory and are intended to provide further explanation of the embodiments as claimed.

BRIEF DESCRIPTION OF THE DRAWINGS

Arrangements and embodiments may be described in detail with reference to the following drawings in which like reference numerals refer to like elements and wherein.

DETAILED DESCRIPTION

Figure 1:
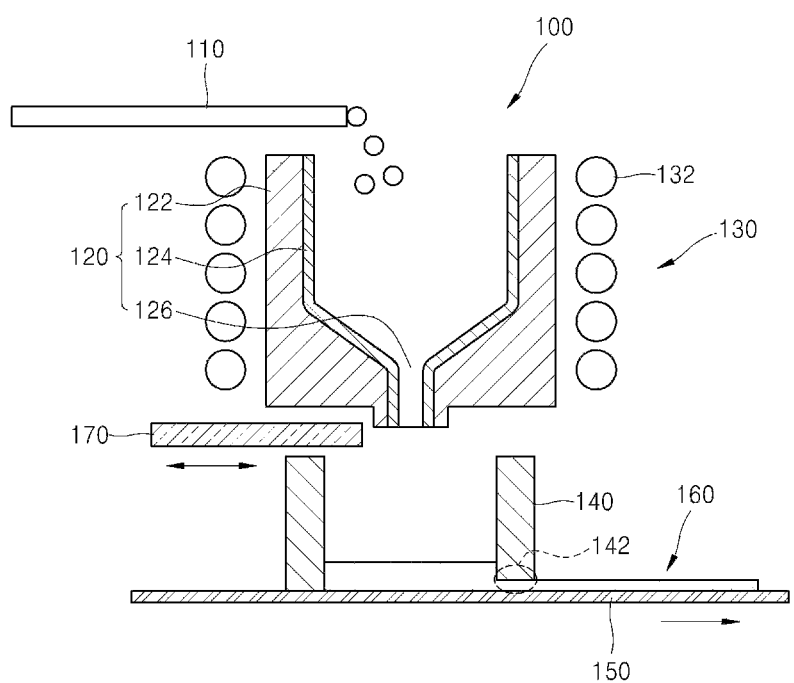
FIG. 1 is a sectional view illustrating a manufacturing apparatus of a silicon thin film including a dual crucible for silicon melting according to an embodiment.

Reference may now be made in detail to specific embodiments, examples of which may be illustrated in the accompanying drawings. Wherever possible, same reference numbers may be used throughout the drawings to refer to the same or like parts. Specific embodiments will be explained in the drawings and the detailed description. However, it is to be understood that the invention is not limited in its application to the details of constriction and the arrangement of components set forth in the following description or illustrated in the following drawings. Reference may now be made in detail to specific embodiments, examples of which may be illustrated in the accompanying drawings. Wherever possible, same reference numbers may be used throughout the drawings to refer to the same or like parts.

As follows, a reusable dual crucible for silicon melting according to an exemplary embodiment and a manufacturing apparatus of a silicon thin film including the same will be described in reference to the accompanying drawings.

FIG. 1 is a sectional view illustrating a manufacturing apparatus of a silicon thin film (hereinafter, a silicon thin film manufacturing apparatus) including a dual crucible for silicon melting according to an exemplary embodiment.

In reference to FIG. 1, a silicon thin film manufacturing apparatus 100 may include a silicon base material introduction part 110, a dual crucible for silicon melting 120, a crucible heating part 130, a molten silicon storage part 140, a transfer substrate 150 and a thin film forming part 160.

The silicon base material introduction part 110 may receive a silicon base material 112 from an external device and it may supply a preset amount of silicon base material to the dual crucible for the silicon melting 120.

The dual crucible for the silicon melting 120 may be configured of a graphite crucible 122 and a quartz crucible 124 insertedly coupled to the graphite crucible 122. The graphite crucible 122 may be container-shaped with an open top and a bottom having an outlet hole 126 formed therein.

In the meanwhile, the quartz crucible 124 may be formed in a corresponding shape to the graphite crucible 122 and it may be insertedly coupled to the graphite crucible 122. The silicon base material 112 may be charged into the quartz crucible 124.

The crucible heating part 130 may melt the silicon base material 112 and it may heat the dual crucible for the silicon melting 120, to form molten silicon.

The crucible heating part 130 may include a coil 132 to surround an outer wall of the dual crucible for the silicon melting 120 and it may heat the dual crucible for the silicon melting 120 having the silicon base material charged therein by using the coil 132.

Such the coil 132 may induction-heat or resistance-heat the dual crucible for the silicon melting 120. As follows, the induction heating will be embodied.

The surface temperature of the molten silicon induction-heated in the dual crucible for the silicon melting 120 may be maintained in a range of 1300° C.~1600° C. to transfer the silicon melt safely after the molten silicon is exhausted without hardened from the crucible. Here, different from metal, it is difficult to directly heat the silicon by electromagnetic induction at approximately 700° C. or less, because the silicon has a low electric conductivity. As a result, the silicon base material may be melted by indirect heating using the heat of the dual crucible 120. When the material arranged in an outer portion of the dual crucible for the silicon melting 120 is graphite (the graphite crucible 122), the graphite crucible may have a substantially high electric conductivity and thermal conductivity in spite of non-metal material. Because of that, heating may be performed smoothly by the electromagnetic induction.

The molten silicon storage part 140 may receive and store the molten silicon melted by the induction heating in the dual crucible for the silicon melting 120. After that, the molten silicon storage part 140 may tap the molten silicon as a preset amount of silicon melt.

The molten silicon storage part 140 may include a tapping hole 142 formed in a bottom thereof to tap the molten silicon there through. The height of the tapping hole 142 may be one of factors for determining the thickness of the silicon thin film and it may be designed to be approximately 0.1~2 mm.

Also, a cooling device (not shown) may be additionally arranged adjacent to the tapping hole 142. In this case, the molten silicon may be tapped from the molten silicon storage part 140 in a cooled or overcooled state.

The transfer substrate 150 may be arranged under the molten silicon storage part 140 and it may transfer the silicon melt tapped from the molten silicon storage part 140. The transfer substrate 150 may be set to be preheated by a preheater (not shown) to reduce a temperature difference with the silicon melt.

The transfer substrate 150 may be formed of a predetermined material having a different thermal expansion coefficient from a thermal expansion coefficient of the silicon. When the thermal expansion coefficient of the transfer substrate 150 is different from that of the silicon, the silicon thin film manufactured after cooling the molten silicon may be separated from the transfer substrate 150 smoothly.

The transfer substrate 150 may be formed of metal or ceramic. Also, it may be formed of a material selected from a group configured of silicon carbide (SiC), silicon nitride ($Si_3N_4$), graphite, aluminum Oxide ($Al_2O_3$) and molybdenum (Mo).

The silicon thin film forming part 160 may form a silicon thin film by cooling the silicon melt transferred thereto. At this time, the silicon thin film forming part 160 may blowing-inject inert gas such as argon gas, helium gas and nitrogen gas toward the molten silicon to cool the molten silicon.

The blowing of inert gas may cool the molten silicon rapidly, only to remove remaining molten silicon. Also, the blowing of inert gas may enable a profile of a surface of the silicon thin film manufactured in a surface polarization process to be controlled efficiently.

In the meanwhile, the temperature of the transfer substrate 150 may be 700° C.~1500° C. to keep the molten silicon unhardened at a boundary with the transfer substrate 150 and to keep the silicon melt from falling from the transfer substrate. Although not shown in the drawings, the transfer substrate 150 may be heated by an external heater and it may be able to maintain that temperature range.

In the meanwhile, the silicon thin film manufacturing apparatus 100 according to the embodiment may further include a gate bar 170. The gate bar 170 may be designed to perform locomotion and it may open and close the outlet hole 126 of the dual crucible 120. In this case, the gate bar 170 may be designed to perform locomotion along an up and down direction and a right and left direction.

As follows, the dual crucible for the silicon melting according to the embodiment will be explained in detail in reference to the accompanying drawings.

Figure 2:
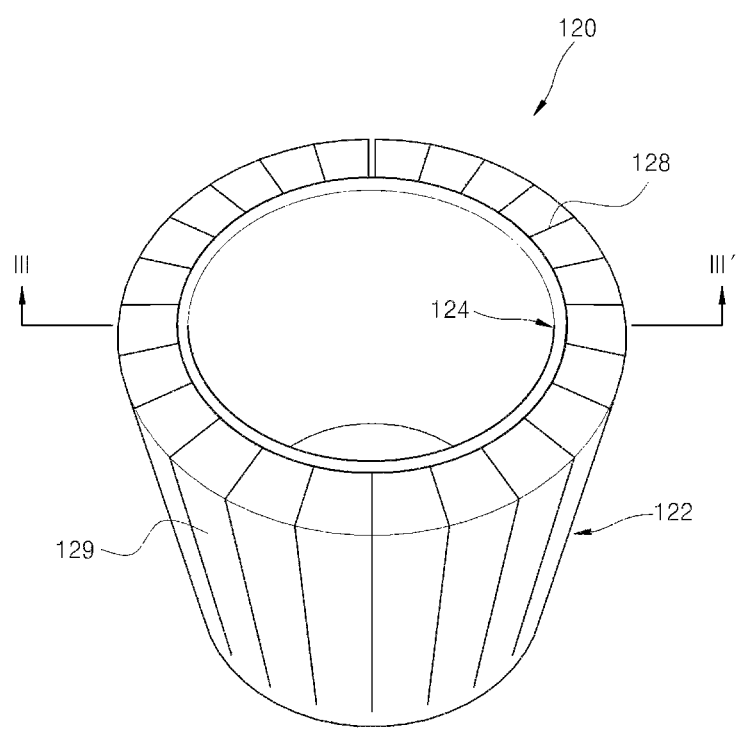
FIG. 2 is an enlarged perspective view illustrating a dual crucible for silicon melting shown in FIG. 1.
Figure 3A:
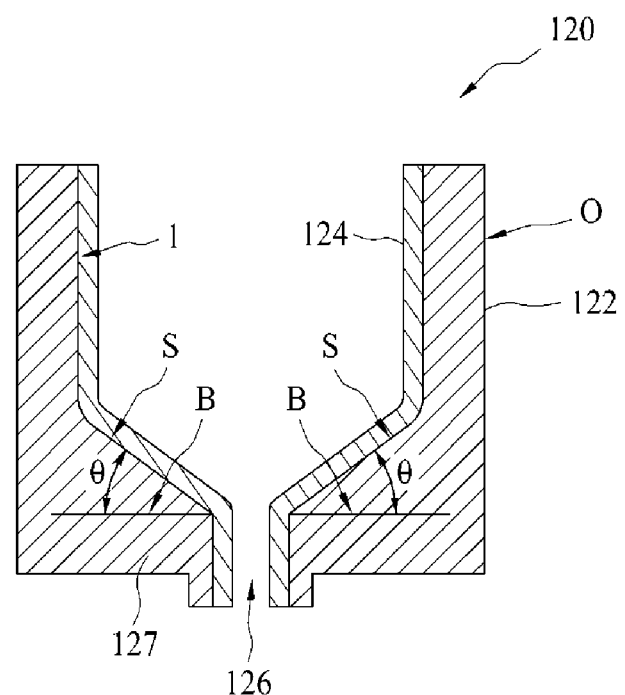
FIGS. 3A and 3B are cut-away views of FIG. 2 along a III-III' line.
Figure 3B:
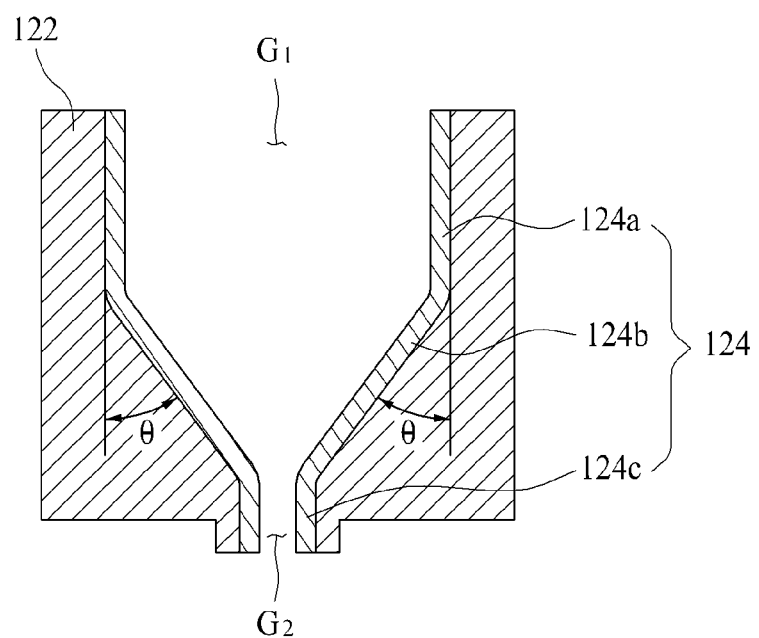

FIG. 2 is an enlarged perspective view illustrating the dual crucible for the silicon melting shown in FIG. 1. FIGS. 3A and 3B are cut-away views of FIG. 2 along a III-III' line.

In reference to FIG. 2 and FIGS. 3A and 3B, the dual crucible for the silicon melting 120 shown in the drawings may include the graphite crucible 122 and the quartz crucible 124.

As shown in FIG. 2, the graphite crucible 122 may include a plurality of slits 128 partially cur-away along a longitudinal direction. For example, an upper portion of the graphite crucible 122 may be cut along a longitudinal direction and a lower portion thereof may not be cut. In contrast, an upper portion of the graphite may not be cut and a lower portion thereof may be cut. Such a slit 128 may be cut away through outer and internal walls (O and I). As a result, the graphite crucible 122 may be divided into segments by the plurality of the slits 128.

When the graphite crucible 122 includes the plurality of the slits 128, the heat generated by the induction coil installed in the outer wall of the graphite crucible 122 may be transmitted to the inside of the crucible strongly and heating efficiency may be enhanced accordingly.

As shown in FIG. 3A, the graphite crucible 122 may include an open top, an outlet part 127 and a slope part (S). The outlet part 127 may have an outlet hole formed in a bottom thereof to exhaust the silicon melt. The slope part (S) may have a slope with respect to a top surface (B) and it may connect the outlet part 127 and the internal wall (I) with each other. Such the graphite crucible 122 may be formed in a container shape with an open top. In this case, the graphite crucible 122 may be designed in a polygonal, circular and oval shape along a plane direction.

The quartz crucible 124 may be insertedly coupled to the graphite crucible 122 and the silicon base material may be charged into the quartz crucible 124. At this time, the quartz crucible 124 may be formed in a correspondingly similar shape to the graphite crucible 122. Such the quartz crucible 124 may be formed of quartz having a higher heat resistance, a smaller thermal expansion coefficient and a more stable chemical property than the graphite.

Even when the dual crucible melting the silicon 120 having the graphite crucible 122 and the quartz crucible 124 inserted in the graphite crucible 122 is heated by the induction heating to increase the temperature of the silicon base material to approximately 1412° C. or more, the quartz crucible 124 inserted in the graphite crucible 122 may be employed as a blocking film configured to block carbon and metal impurities from being drawn into the molten silicon from the graphite crucible 122. Because of that, the molten silicon may be prevented from being contaminated.

Especially, the quartz crucible 124 may be formed to have a corresponding surface area to the graphite crucible 122. When the quartz crucible 124 is designed as mentioned above, the carbon impurities from the graphite crucible 122 may be prevented from being drawn into the molten silicon ultimately.

In the meanwhile, a surface of the slope part (S) formed in the graphite crucible 122 may be designed to have a slope (θ) of 3° or more with respect to the top surface (B) of the outlet part 127. In this case, it is preferable that the upper limit of the slope (θ) needs not be preset but it may be designed to be 90° or less, considering that the maximum slope between the opt surface (B) of the outlet part and the internal wall (I) is 90°.

As the surface of the slope part (S) has the slope of 3° or more with respect to the top surface (B) of the outlet part 127, the driving force of the molten silicon toward the outlet hole 126 may be increased by the gravity and all of the molten silicon may be exhausted via the outlet hole 126 without remaining in the quartz crucible 124.

In the meanwhile, the quartz crucible 124 may include an inlet part 124a, a slope part 124b and an outlet part 124c as shown in FIG. 3B.

An opening (G1) may be formed in the inlet part 124a and the silicon base material may be charged via the opening (G1).

The slope part 124b may have a preset slope of an acute angle with respect to a surface of the inlet part 124a and it may be extended from the inlet part 12a. at this time, the acute angle may be 87° at the most to exhaust all of the molten silicon via an opening (G2) of the outlet part 124c.

The outlet part 124c may have a preset opening smaller than the opening (G1) of the inlet part 124a and it may be extended from the slope part 124b in parallel to the inlet part 124a.

At this time, the graphite crucible 122 may have a profile correspondingly surround the quartz crucible 124. For example, an overall inner surface of the graphite crucible 122 may be formed to surface-contact with an outer surface of the quartz crucible 124. In this case, the quartz crucible 124 and the graphite crucible 122 may are insertedly assembled with each other, to enable the assembly process simpler and more convenient.

According to this embodiment, the profile of the inner surface of the graphite crucible may be corresponding to the profile of the outer surface of the quartz crucible. However, the profile of the inner surface of the graphite crucible may be variable only if it can surround the quartz crucible. As a result, after manufacturing the silicon thin film, all of the molten silicon may be exhausted via the outlet hole, without remaining in the dual crucible for the silicon melting, and the dual crucible for the silicon melting may be cleaned simply in a cleaning process. The quartz crucible inserted in the dual crucible for the silicon melting may be reusable at least two times advantageously.

As a result, the silicon thin film manufactured by using the silicon thin film manufacturing apparatus including the dual crucible for the silicon melting may be a uniformly high sheet resistance of approximately 1~2 kΩ/square, which will be explained in detail in reference to following Table 1.

Table 1 shows a sheet resistance and a standard deviation of a polycrystal silicon wafer manufactured according to Embodiments 1 to 4 and Example 1. At this time, there may be manufactured a polycrystal silicon wafer having a thickness of 0.3 by using a silicon thin film manufacturing apparatus including a dual crucible for silicon melting that can be reused one to four times according to Embodiment 1-4, respectively. Also, there may be manufactured a polycrystal silicon wafer having a thickness of 0.3 mm by using a silicon thin film manufacturing apparatus only having the graphite crucible according to Example 1.

TABLE 1

| Classification | Reuse Number | Sheet Resistance (kΩ/square) | Deviation Difference (%) |
|---|---|---|---|
| Embodiment 1 | 1 | 1.456 | 0.20 |
| Embodiment 2 | 2 | 1.866 | 0.16 |
| Embodiment 3 | 3 | 1.216 | 0.11 |
| Embodiment 4 | 4 | 1.271 | 0.25 |
| Example 1 | — | 0.003 | 0.10 |

In reference to Table 1, it may be identified that a couple of sheet resistances kΩ/square are measured in Embodiment 1 to 4, regardless of the reuse number. The deviation difference 1~4 is be 0.20, 0.16, 0.11 and 0.25% in Embodiments, respectively. The deviation difference of Example 1 is 0.10%.

In contrast, when only the graphite crucible is used like in Example 1, without the quartz crucible, it is identified that the sheet resistance of the polycrystal silicon wafer is decreased a couple of kΩ/square, specifically, to be 0.003 kΩ/square. This is because the polycrystal silicon wafer is contaminated by the carbon and metal impurities of the graphite crucible that are mixed with the molten silicon.

However, similar sheet resistances are measured in Embodiment 1~4, regardless of the reuse number. Based on Table 1, it can be known that there is no problem in reusing the quartz crucible of the dual crucible for the silicon melting.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A manufacturing apparatus of a silicon thin film comprising:
    a silicon base material introduction part to supply a silicon base material;
    a dual crucible for silicon melting mounted under the silicon base material introduction part;
    a crucible heating part to heat the dual crucible for the silicon melting, to form molten silicon by melting the silicon base material;
    a molten silicon storage part to tap the molten silicon stored therein as a preset amount of silicon melt after storing the molten silicon therein;
    a transfer substrate disposed under the molten silicon storage part, to transfer the tapped silicon melt;
    a gate bar to open and close an outlet part configured to the dual crucible; and
    a thin film forming part to form a silicon thin film by cooling the silicon melt transferred by the transfer substrate,
    wherein the dual crucible for the silicon melting comprises a graphite crucible formed in a container shape with an open top and a bottom having the outlet part formed therein to exhaust silicon melt, the graphite crucible comprising a slope part configured to connect the outlet part and an inner wall with each other, with a predetermined slope with respect to a top surface of the outlet part; and a quartz crucible insertedly coupled to the graphite crucible, with being formed in a corresponding shape to the graphite crucible, the quartz crucible having a silicon base material charged therein.

2. The manufacturing apparatus of the silicon thin film according to claim 1, wherein the slope part has a slope of 3° or more with respect to a top surface of the outlet part.

3. The manufacturing apparatus of the silicon thin film according to claim 1, wherein the crucible heating part induction-heats or resistance-heats the dual crucible for the silicon melting.

4. The manufacturing apparatus of the silicon thin film according to claim 3, wherein the crucible heating part comprises a coil to surround an outer wall of the dual crucible for the silicon melting.

5. The manufacturing apparatus of the silicon thin film according to claim 1, wherein the crucible heating part heats the dual crucible for the silicon melting to make a surface temperature of the molten silicon have a range of 1300° C.~1600° C.

6. The manufacturing apparatus of the silicon thin film according to claim 1, wherein the transfer substrate is formed of a predetermined material having a different thermal expansion coefficient than a thermal expansion coefficient of the silicon.

7. The manufacturing apparatus of the silicon thin film according to claim 6, wherein the transfer substrate is formed of a predetermined material selected from a group configured of metal, ceramic, SiC, $Si_3N_4$, graphite, $Al_2O_3$ and molybdenum (Mo).

8. The manufacturing apparatus of the silicon thin film according to claim 1, wherein the temperature of the transfer substrate has a range of 700° C.~1500° C.

* * * * *